United States Patent [19]
Chia et al.

[11] Patent Number: 5,841,198
[45] Date of Patent: Nov. 24, 1998

[54] BALL GRID ARRAY PACKAGE EMPLOYING SOLID CORE SOLDER BALLS

[75] Inventors: Chok J. Chia, Cupertino; Patrick Variot, San Jose; Maniam Alagaratnam, Cupertino, all of Calif.

[73] Assignee: LSI Logic Corporation, Milpitas, Calif.

[21] Appl. No.: 837,685

[22] Filed: Apr. 21, 1997

[51] Int. Cl.⁶ ............ H01L 23/48; H01L 23/52; H01L 29/40
[52] U.S. Cl. .......... 257/780; 257/738; 257/778; 257/779
[58] Field of Search ............ 257/778–80, 738

[56] References Cited

U.S. PATENT DOCUMENTS

| | | | |
|---|---|---|---|
| 2,934,685 | 4/1960 | Jones | 257/738 |
| 3,496,428 | 2/1970 | Volder | 257/780 |
| 3,809,625 | 5/1974 | Brown et al. | 257/778 |
| 4,600,600 | 7/1986 | Pammer et al. | 427/89 |
| 5,334,857 | 8/1994 | Mennitt et al. | 257/48 |
| 5,461,261 | 10/1995 | Nishiguchi | 257/781 |
| 5,468,995 | 11/1995 | Higgins, III | 257/697 |
| 5,506,756 | 4/1996 | Haley | 361/789 |
| 5,640,052 | 6/1997 | Tsukamoto | 257/781 |

OTHER PUBLICATIONS

"Multi–Layer Tab Tape Having Distinct Signal, Power and Ground Planes, Semiconductor Device Assembly Employing Same, Apparatus for and Method of Assembling Same," U.S. Patent Application Serial No. 08/625,641 filed Mar. 29, 1996.

*Primary Examiner*—Teresa M. Arroyo
*Attorney, Agent, or Firm*—Townsend and Townsend and Crew LLP; Henry K. Woodward

[57] ABSTRACT

A ball grid array package utilizes solder balls having central cores of a material with a higher melting point than solder material surrounding the core. When the ball grid package and motherboard assembly are heated to the melting point of the solder material, the cores remain solid and function as spacers in preventing direct contact of the package surface and the motherboard surface, thus preventing molten solder from being squashed and flowing to adjacent ball contacts.

6 Claims, 2 Drawing Sheets

BALL GRID ARRAY PACKAGE EMPLOYING SOLID CORE SOLDER BALLS

BACKGROUND OF THE INVENTION

This invention relates generally to integrated circuit packages, and more particularly the invention relates to ball grid array packages and solder balls used therein.

The semiconductor integrated circuit chip must be mounted and sealed on a supporting substrate with the substrate providing interconnect electrical leads for supplying electrical signals and voltages to and from the integrated circuit. The ball grid array package is presently used for housing and interconnecting large scale integrated circuits. See copending application Ser. No. 08/625,641 filed Mar. 29, 1996, incorporated herein by reference. Typically, the substrate is a ceramic or laminate which includes metal lead patterns to which the chip contacts are wire bonded. Solder balls are then used to interconnect the substrate leads to electrical contacts on a printed circuit motherboard on which the substrate is mounted as a component in a larger circuit or system.

In most cases, the solder balls are made from material that melts when exposed to the temperature of the mounting process, and forms a joint between the package and the motherboard. The solder balls together with solder paste that is added to the motherboard become the joint material. In most cases, the mating surfaces of the package and the motherboard are uneven, and gaps between the package and the motherboard are not uniform. Thus, some of the solder joints can be squashed, resulting in the solder from adjacent joints being shorted together and causing a circuit defect.

The present invention is directed to overcoming this problem of shorted solder joints in ball grid array packages.

SUMMARY OF THE INVENTION

In accordance with the invention, solder balls for ball grid array packages have central cores of a material having a higher melting point than solder material surrounding the core. When the ball grid package and motherboard assembly are heated to the melting point of the solder material, the core remains solid and functions as a spacer preventing direct contact of the package surface and the motherboard surface. Thus, the molten solder is prevented from being squashed and flowing to adjacent ball contacts.

The invention and objects and features thereof will be more readily apparent from the following detailed description and dependent claims when taken with the drawing.

DETAILED DESCRIPTION OF ILLUSTRATIVE EMBODIMENTS

Figure 1:
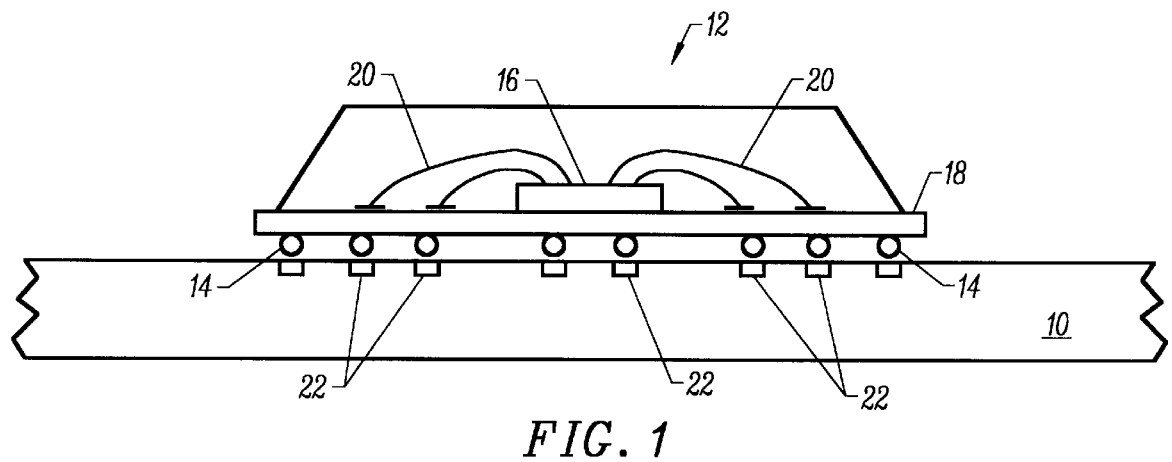
FIG. 1 is a section view illustrating the mounting of a ball grid array package on a motherboard.

Referring now to the drawings, FIG. 1 is a section view illustrating a portion of a printed circuit motherboard 10 and a ball grid array package 12 mounted thereon with solder balls 14 therebetween. An integrated circuit chip 16 is mounted on a substrate 18 with wire bonding 20 interconnecting contacts on integrated circuit 16 to wire bonding pads on substrate 18. Solder balls 14 electrically interconnect solder ball pads on substrate 18 with corresponding pads shown at 22 on motherboard 10. The assembly is placed in a heated environment having a temperature sufficient to melt the solder balls 14 thus forming solder joints between the solder ball pads of motherboard 10 and substrate 18.

Figure 2A:
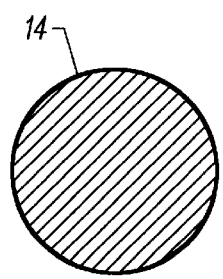
FIGS. 2A and 2B are section views of a conventional solder ball and a solder ball in accordance with the present invention, respectively.
Figure 2B:
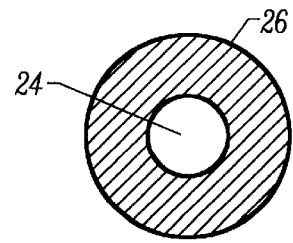

FIG. 2 is a section view of a conventional solder ball 14 formed of homogeneous solder material (e.g., 63% tin, 37% lead) which has a melting temperature on the order of 200° C. Due to uneven surfaces of substrate 18 and motherboard 10, gaps between the motherboard and substrate are not uniform and some of the solder joints can be squashed, resulting in excessive solder flow and shorting of adjacent solder joints.

To overcome this problem, a solid core solder ball, as illustrated in section view in view 2B is provided. The solder ball includes a core 24 of a first material which is surrounded by a layer of solder 26. The melting point of first material 24 is higher than the melting point of solder 26, thus core 24 functions as a spacer between substrate 18 of the package and the motherboard. For example, the core can comprise a lead tin alloy having a higher melting point than conventional solder, such as 90% lead and 10% tin by weight which melts at approximately 290° C. Alternatively, a solid core of copper can be used. In fabricating the solid core solder balls the solder can be plated onto the solid core, or the solid core can be dipped in liquid solder with surface tension coating the core material.

Figure 3A:
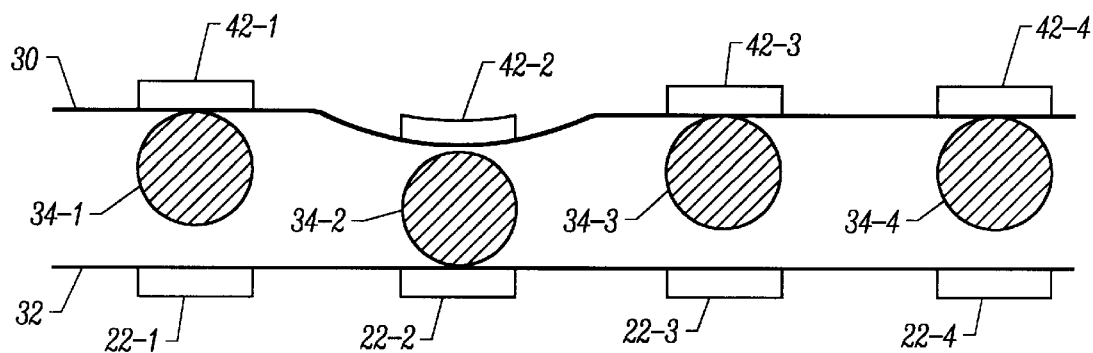
FIGS. 3A, 3B illustrate portions of a ball grid array package surface and a printed circuit motherboard surface prior to solder ball melt, and after solder ball melt, respectively, using conventional solder balls.
Figure 3B:
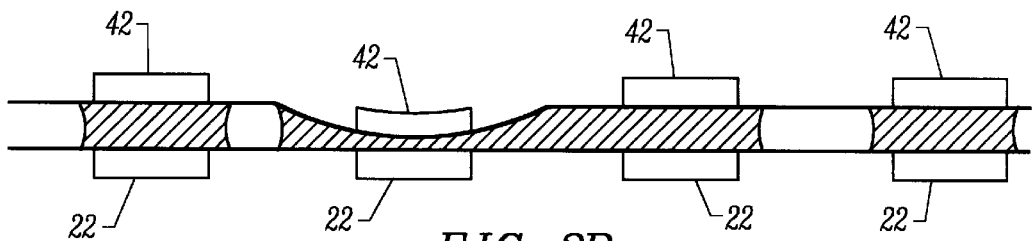
Figure 4A:
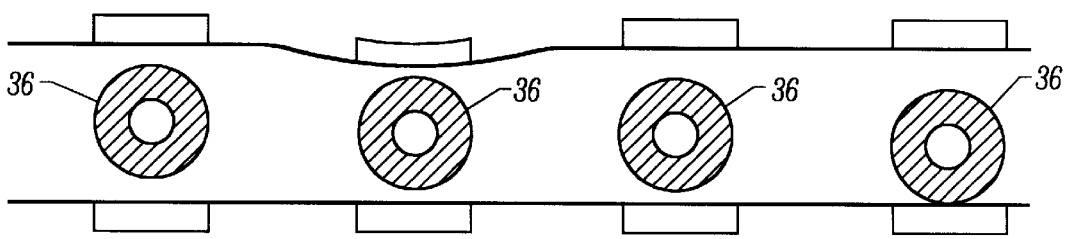
FIGS. 4A, 4B illustrate portions of a ball grid array package surface and a printed circuit motherboard surface before and after solder ball melt using solder balls in accordance with the present invention, respectively.
Figure 4B:
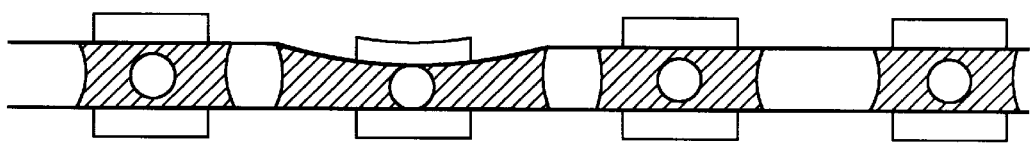

This is illustrated in the section views of portions of surface 30 of a substrate and the underlying surface 32 of the motherboard illustrated in FIGS. 3A, 3B for conventional solder balls 34 and in FIGS. 4A, 4B for solder balls 36 in accordance with the invention. Surface 30 of substrate 18 is illustrated as uneven with the space between pads 42-2 and 22-2 being less than the gaps between the other contacts. In FIG. 3B after melting of the solder balls, the solder material from solder ball 34-2 and from solder ball 34-3 can flow together creating a short between contacts 42-2, 42-3, 22-2, and 22-3.

This problem is alleviated using the solid core solder balls in accordance with the present invention as illustrated in FIGS. 4A, 4B. The solid cores of the solder balls function as spacers in FIG. 4B after the solder balls have been melted thereby preventing the solder joints from being squashed with solder from adjacent balls being shorted together, as in FIG. 3B.

The use of solid core solder balls in accordance with the invention allows the manufacture and use of a larger ball grid array package. The use of an outer layer of solder contributes to the total volume of solder in the joint and makes for an easier mounting process. Further, the solid core standoffs makes flatness of the package and the motherboard less critical during the mounting of the package and prevents shorting of the contacts from excessive squashing.

While the invention has been described with reference to specific embodiments, the description is illustrative of the invention and is not to be construed as limiting the invention. For example, the solid core solder balls can have applicability in other package applications, such as flip chip packaging. Thus various modifications and applications may appear to those skilled in the art without departing from the true spirit and scope of the invention as defined by the appended claims.

What is claimed is:

1. A ball grid array package comprising:

a substrate for mounting an integrated circuit chip on one surface thereof, said substrate having a plurality of wire bonding pads receiving wire bonds from said chip and a plurality of solder ball pads, an integrated circuit chip mounted on said substrate, a plurality of wire bonds interconnecting said chip and said wire bonding pads, and a plurality of solder balls for interconnecting said solder ball pads to pads on a mother board, said solder balls having central cores of an alloy of lead and tin having a higher melting point than solder material surrounding said cores, said central cores functioning as spacers between said substrate and the surface of a motherboard, and material encapsulating said integrated circuit chip and wire bonds on said substrate.

2. The ball grid array package as defined by claim 1 wherein said core comprises approximately 90% lead and 10% tin by weight.

3. A ball grid array package comprising:

a substrate for mounting an integrated circuit chip on one surface thereof, said substrate having a plurality of wire bonding pads receiving wire bonds from said chip and a plurality of solder ball pads, an integrated circuit chip mounted on said substrate, a plurality of wire bonds interconnecting said chip and said wire bonding pads, a plurality of solder balls for interconnecting said solder ball pads to pads on a mother board, said solder balls having central cores of copper having a higher melting point than solder material surrounding said cores, said central cores functioning as spacers between said substrate and the surface of a motherboard, and the ball grid array package as defined by claim 1 and further including material encapsulating said integrated circuit chip and wire bonds on said substrate.

4. A solder ball for use in ball grid array packages and the like comprising:

a central core of an alloy of lead and tin which melts at approximately 290° C. surrounded by a layer of solder material, said first material having a melting point higher than said solder material whereby said central core can function as a spacer between a substrate contact and a motherboard contact when said contacts are electrically connected by said solder material.

5. The solder ball as defined by claim 4 wherein said central core comprises approximately 90% lead and 10% tin by weight, and said solder comprises approximately 37% lead and 63% tin by weight.

6. A solder ball for use in ball grid array packages and the like comprising:

a central core of copper surrounded by a layer of solder material, said first material having a melting point higher than said solder material whereby said central core can function as a spacer between a substrate contact and a motherboard contact when said contacts are electrically connected by said solder material.

* * * * *